United States Patent
ReMine et al.

(10) Patent No.: US 11,379,627 B2
(45) Date of Patent: Jul. 5, 2022

(54) VEHICULAR LIQUID CONTAINER DESIGN AND MANUFACTURE

(71) Applicant: THE BOEING COMPANY, Chicago, IL (US)

(72) Inventors: Daniel ReMine, Madison, AL (US); Richard Joel Thompson, Huntsville, AL (US); Sean Auffinger, Ladson, SC (US)

(73) Assignee: The Boeing Company, Chicago, IL (US)

( * ) Notice: Subject to any disclaimer, the term of this patent is extended or adjusted under 35 U.S.C. 154(b) by 1077 days.

(21) Appl. No.: 15/476,480

(22) Filed: Mar. 31, 2017

(65) Prior Publication Data
US 2018/0285518 A1 Oct. 4, 2018

(51) Int. Cl.
*G06F 30/15* (2020.01)
*G06F 30/23* (2020.01)

(52) U.S. Cl.
CPC .............. *G06F 30/15* (2020.01); *G06F 30/23* (2020.01)

(58) Field of Classification Search
CPC .................................................. G06F 17/5095
See application file for complete search history.

(56) References Cited

U.S. PATENT DOCUMENTS

| | | | | |
|---|---|---|---|---|
| 7,236,914 B1 * | 6/2007 | Zyskowski | ......... | G06F 17/5009 703/8 |
| 7,831,418 B1 * | 11/2010 | Sendhoff | ............ | G06F 17/5095 703/6 |
| 8,219,228 B2 * | 7/2012 | Yucel | .................. | G06F 17/5095 700/103 |
| 8,521,495 B2 * | 8/2013 | Ray | ..................... | G06F 17/5009 702/50 |
| 9,038,961 B2 * | 5/2015 | Deslandes | ........... | G06F 17/5095 244/173.1 |

(Continued)

OTHER PUBLICATIONS

Clement Breton et al., Step towards certification of fuel system drop test requirement for different helicopters by simulation, May 5-7, 2015, American Helicopter Society 71st Annual Forum (Year: 2015).*

(Continued)

*Primary Examiner* — Jay Hann
(74) *Attorney, Agent, or Firm* — Womble Bond Dickinson (US) LLP

(57) ABSTRACT

A method for certifying a design of a liquid container onboard a vehicle for manufacture of the liquid container is provided. The method includes generating a computer geometric model of the liquid container according to the design, and executable code to reproduce dynamics and operational parameters of the vehicle, with the dynamics of the vehicle including dynamics during a vehicle maneuver that is selectable from a database of vehicle dynamics for a plurality of vehicle maneuvers. The method includes executing a simulating application to perform a simulation of liquid sloshing in the liquid container onboard the vehicle is performed subject to the dynamics and operational parameters, and iterate the simulation to refine a prediction of loads and stresses on the liquid container from the simulation produced thereby. Locations within the liquid container more vulnerable to fatigue-risk are identified based on the prediction, and output for certification of the design.

21 Claims, 11 Drawing Sheets

(56) References Cited

U.S. PATENT DOCUMENTS

| | | | |
|---|---|---|---|
| 9,760,660 B2* | 9/2017 | Spira | G06F 17/5009 |
| 10,019,544 B2* | 7/2018 | Bertilsson | G06F 17/5018 |
| 2005/0107963 A1* | 5/2005 | Campbell | G05B 17/02 |
| | | | 702/42 |
| 2010/0318336 A1* | 12/2010 | Falangas | G05B 17/02 |
| | | | 703/8 |
| 2012/0123754 A1* | 5/2012 | Bodin | G06F 17/5018 |
| | | | 703/2 |

OTHER PUBLICATIONS

Singal, V., et al. "CFD Analysis of a Kerosene Fuel Tank to Reduce Liquid Sloshing" Procedia Engineering, vol. 69, pp. 1365-1371 (2014) (Year: 2014).*

Firouz-Abadi, R., et al. "A 3D BEM model for liquid sloshing in baffled tanks" Int'l J. for Numerical Methods in Engineering, vol. 76, pp. 1419-1433 (2008) (Year: 2008).*

Sances, D., & Gangadharan, S. "CFD Fuel Slosh Modeling of Fluid-Structure Interaction in Spacecraft Propellant Tanks with Diaphragms" American Institute of Aeronautics & Astronautics, 51st AIAA Structures Structural Dynamics & Materials Conf., AIAA 2010-2955 (2010) (Year: 2010).*

Marsell, B., et al. "Using CFD Techniques to Predict Slosh Force Frequency and Damping Rate" American Institute of Aeronautics & Astronautics, 50th AIAA Structures Structural Dynamics & Materials Conf., AIAA 2009-2683 (2009) (Year: 2009).*

Leuva, D. "Experimental Investigation and CFD Simulation of Active Damping Mechanism for Propellant Slosh in Spacecraft Launch Systems" Masters Thesis, Embry Riddle Aeronautical U. (2011) (Year: 2011).*

D'Alessandro, V. "Modeling of Tank Vehicle Dynamics by Fluid Sloshing Coupled Simulation" PhD Thesis, Politecnico di Milano (2011) (Year: 2011).*

Yan, G. "Liquid Slosh and its Influence on Braking and Roll Responses of Partly Filled Tank Vehicles" PhD Thesis, Concordia U. (2008) (Year: 2008).*

Aquelet, N., et al. "A New ALE Formulation for Sloshing Analysis" Structural Engineering & Mechanics, vol. 16, No. 4 (2003) (Year: 2003).*

Hirt, C.W. & Nichols, B.D. "Volume of Fluid (VOF) Method for the Dynamics of Free Boundaries" J. Computational Physics, vol. 39, pp. 201-225 (1981) (Year: 1981).*

Shahrokhi, M., et al. "Numerical modeling of baffle location effects on the flow pattern of primary sedimentation tanks" Applied Mathematical Modeling, vol. 37, pp. 4486-4496 (2013) (Year: 2013).*

\* cited by examiner

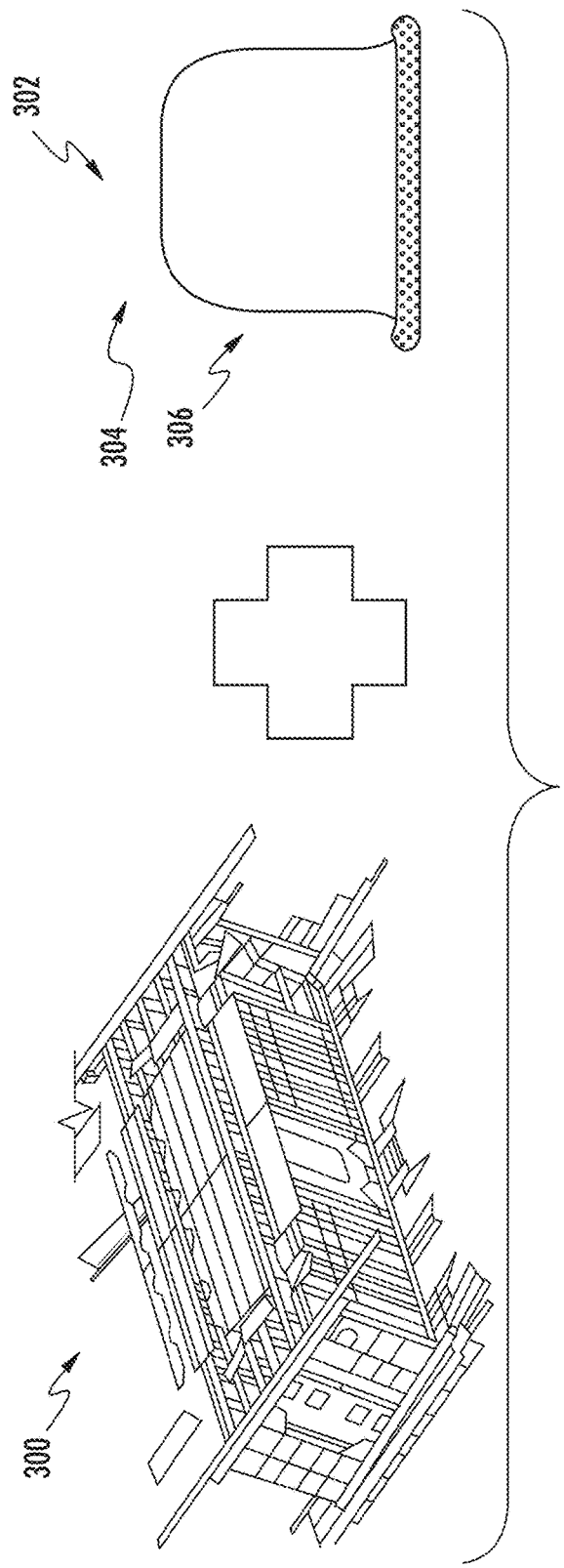
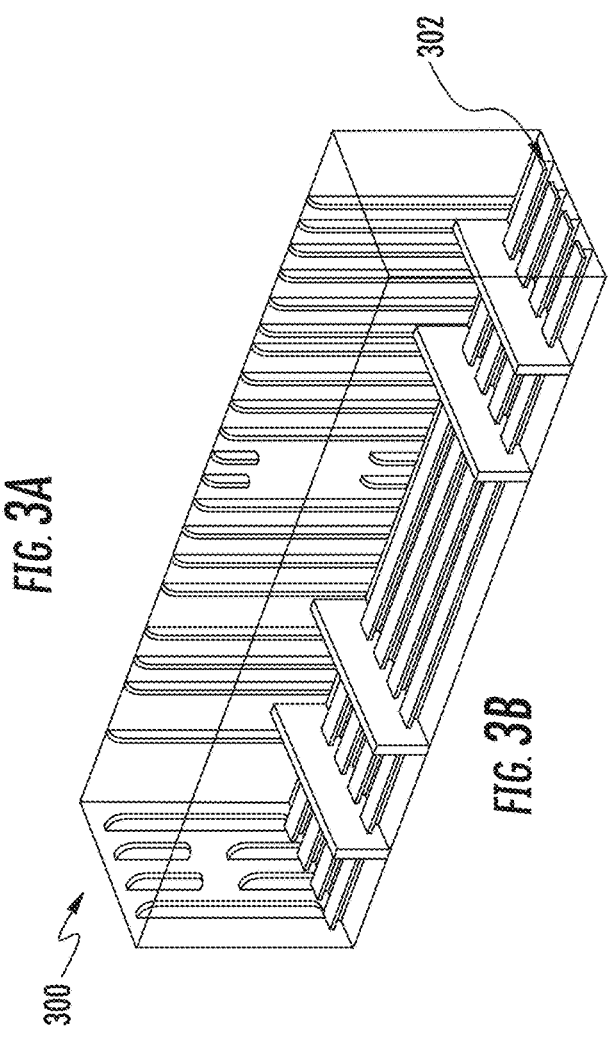
FIG. 3A
FIG. 3B

VEHICULAR LIQUID CONTAINER DESIGN AND MANUFACTURE

TECHNOLOGICAL FIELD

The present disclosure relates generally to the design and the manufacture of a liquid container onboard a vehicle and, in particular, to certifying the design of a liquid container for manufacture based on a slosh prediction.

BACKGROUND

The sloshing of liquid inside a liquid container onboard a vehicle such as an aircraft induces stress and fatigue on the container as well as its integrated components, such as screws, bolts, caps, hoses, sealants, pylons, struts, fairings, nozzles and the like. Due to the effects of vehicle dynamics on sloshing, this stress and fatigue can be especially heightened during more extreme vehicle maneuvers. Stress and fatigue can lead to cracking, crumbling, or other types of part failure, which can lead to loss of functionality of components, loss of functionality of the liquid container, introduction of foreign object debris, leakage, introduce electrical/magnetic vulnerabilities, and more.

In order to mitigate these risks of part failure inside the liquid container, analysis teams use experimentation tools to understand and predict the risks. The teams may use this information to optimize the design of the liquid container and its integrated components and to certify that requirements for reliability and risk tolerance are met.

The design and certification of a liquid container and its components can be expensive and laborious. Current certification processes do not provide sufficient feedback to designers of the liquid container and components to understand the physical conditions and risks that the liquid container and components will be subjected to and to sufficiently improve the design and implementation accordingly. Shortcomings of the current processes include the absence of genuine vehicle dynamics, as well as qualitative rather than quantitative analysis results. Current processes also do not provide sufficient feedback for understanding the physical conditions and risks on a vehicular liquid container and its components. In many cases current processes only provide analysis results that are course, qualitative, and time-averaged rather than fine (continuous), quantitative, and temporal. Additionally, none of these processes have integrated the experimentation into a database of vehicle data that allows for testing and certification under the direct selection of the most extreme vehicle maneuvers of interest.

Therefore it would be desirable to have a system and method that takes into account at least some of the issues discussed above, as well as other possible issues.

BRIEF SUMMARY

Example implementations of the present disclosure are generally directed to a system, and corresponding method and computer-readable storage medium for certifying a design of a liquid container. Example implementations provide computational models that develop a virtual test bed process for exploring the action of liquid slosh on a container cap design and other internal components within a liquid container such as a fuel tank onboard an aircraft. The system includes an option of using recorded flight data to incorporate real flight maneuver dynamics into the simulation. Utilization of the system has the potential to significantly reduce the costs associated with fuel tank and fuel-tank-component testing as well as deliver certification of parts and liquid container based on the quantification of slosh impact and risk as opposed to just qualitative slosh predictions in the place of qualitative binary results. It greatly improves accuracy and the level of certification detail, and doing so while directly processing recorded flight data to incorporate real flight dynamics to account for the effects of the most extreme flight maneuvers. Additionally, the system provides a framework for integrating sub-processes and provides predictive feedback.

Example implementations are primarily described in the context of fuel tanks onboard aircraft, but other liquid containers onboard aircraft and other vehicles are also contemplated. Aircraft fuel tanks in general contain multiple intricate components requiring certification under their full range of flight maneuvers. Spacecraft can have very complicated liquid cryogenic systems and microgravity formation of liquids during launch and reentry that can be characterized by very complicated wave motion. Ships and submarines can have water ballast tanks in which complicated wave motion may cause problems for internal component design within these tanks. More generally, this includes any tank or container used for liquid storage, including: integrated tanks, rigid and/or removable tanks, bladder tanks, tip tanks, conformal tanks, drop and/or pylon tanks, ballast tanks including saddle ballasts, cryogenic liquid tanks, septic tanks, and/or cooling tanks or reservoirs. A sample list of components and parts of applicability include: fuel pump, fuel filter, fuel injector, seal caps, sensors, hoses, valves, clamps, plugs, screws, bolts, sealants, struts, pylons, baffles, and other components of the fuel tanks, as well as additional components of other vehicle liquid tanks and containers. The certification of the design of these internal components is a significant problem that spans these many different vehicle environments, systems, and components, all of which would fit into the proposed framework of example implementations of the present disclosure.

Example implementations disclosed herein provide certification teams with accurate, quantified, high-fidelity predictions of the stress and "locations of fatigue-risk" on tanks and components within the tanks. These high-fidelity predictions are not available via current experimental testing. Providing stress and fatigue-risk locations on the tanks and components within the tanks while the tank/components are being subjected to extreme vehicle maneuvers selected from an integrated database of vehicle dynamics data, are also not possible in the current experimental setup. Additionally, this approach reduces the associated experimentation costs through efficient framework integration of all certification sub-processes.

The present disclosure thus includes, without limitation, the following example implementations.

Some example implementations provide a method for certifying a design of a liquid container onboard a vehicle, the method comprising generating a computer geometric model of the liquid container according to the design of the liquid container; generating executable code to reproduce dynamics and operational parameters of the vehicle, the dynamics of the vehicle including dynamics during a vehicle maneuver that is selectable from a database of vehicle dynamics for a plurality of vehicle maneuvers; executing a simulating application, via a computer processor configured to access the computer geometric model and the executable code, to at least: perform a simulation of liquid sloshing in the liquid container onboard the vehicle subject to the dynamics and operational parameters, including the dynamics during a selected one or more of the plurality of vehicle maneuvers, and produce a prediction of loads and stresses on the liquid container from the simulation, the prediction having an associated prediction error; and iterate the simulation to reduce the associated prediction error and thereby refine the prediction of loads and stresses on the liquid container; identifying respective locations within the liquid container that are more vulnerable to fatigue-risk based on the prediction of loads and stresses on the liquid container; and outputting the respective locations and the prediction of stresses on the liquid container at least at the respective locations, including in at least one instance, an indication of certification of the design of the liquid container based thereon.

In some example implementations of the method of any preceding or any subsequent example implementation, or any combination thereof, the liquid container includes a plurality of components integrated or assembled thereon, and generating the computer geometric model of the liquid container includes generating a first computer geometric model of the liquid container without the plurality of components; generating a plurality of second computer geometric models of the plurality of components; and integrating the first computer geometric model and the plurality of second computer geometric models to generate the computer geometric model of the liquid container.

In some example implementations of the method of any preceding or any subsequent example implementation, or any combination thereof, generating the executable code to reproduce dynamics and operational parameters of the vehicle includes receiving selected dynamics from the database of vehicle dynamics for the plurality of vehicle maneuvers including two or more of takeoff, launch, ascent, roll, bank, descent, laminar or turbulent cruise, evasive maneuvers, right/left turn, U-turn, lane change, launch from stop, brake, or curve-handling.

In some example implementations of the method of any preceding or any subsequent example implementation, or any combination thereof, generating the executable code to reproduce dynamics and operational parameters of the vehicle includes receiving operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container.

In some example implementations of the method of any preceding or any subsequent example implementation, or any combination thereof, executing the simulating application to perform the simulation includes executing the simulating application to perform the simulation to produce the prediction of loads and stresses including a pressure and a velocity flow field induced throughout an interior of the liquid container, and wherein identifying respective locations within the container that are more vulnerable to fatigue-risk includes determining a location of a fluid interphase boundary surface based on the pressure and the velocity flow field.

In some example implementations of the method of any preceding or any subsequent example implementation, or any combination thereof, outputting the respective locations and the prediction of stresses includes, in at least one other instance, producing a modified design of the liquid container based on the respective locations within the liquid container that are more vulnerable to fatigue-risk, and the prediction of stresses on the liquid container at least at the respective locations; generating a modified computer geometric model of the liquid container according to the modified design; and re-executing the simulating application via the computer processor configured to access the modified computer geometric model and the executable code.

In some example implementations of the method of any preceding or any subsequent example implementation, or any combination thereof, outputting the design for production of the liquid container according thereto.

Some example implementations provide an apparatus for certifying a design of a liquid container onboard a vehicle for manufacture of the liquid container. The apparatus comprises a processor and a memory storing executable instructions that, in response to execution by the processor, cause the apparatus to at least perform the method of any preceding example implementation, or any combination thereof. This may include implementation of a liquid container certification system including a modeling subsystem, parameters and dynamics subsystem and simulation subsystem coupled to one another and configured to perform steps of the method.

Some example implementations provide a computer-readable storage medium that is non-transitory and has computer-readable program code portions stored therein that in response to execution by a processor, cause an apparatus to at least perform the method of any preceding example implementation, or any combination thereof.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

FIG. 3A is a schematic illustration of a liquid container and a component of the liquid container, according to principles of the present disclosure;

FIG. 3B is a schematic illustration of the component integrated within the liquid container of FIG. 3A, according to principles of the present disclosure;

DETAILED DESCRIPTION

Figure 1:
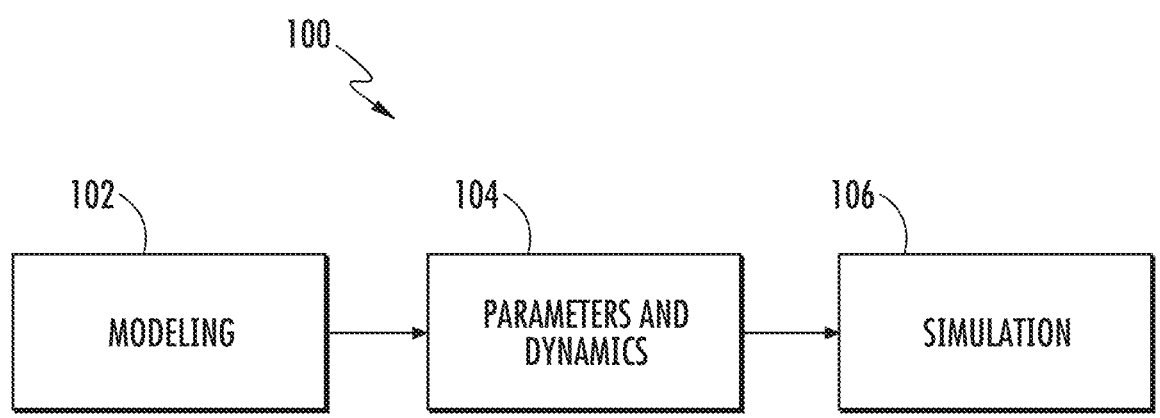
FIG. 1 is a block diagram of a system for certifying a design of a liquid container onboard a vehicle for manufacture of the liquid container, according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference to something as being a first, second or the like should not be construed to imply a particular order. Also, for example, reference may be made herein to quantitative measures, values, relationships or the like (e.g., planar, coplanar, perpendicular). Unless otherwise stated, any one or more if not all of these may be absolute or approximate to account for acceptable variations that may occur, such as those due to engineering tolerances or the like. Like reference numerals refer to like elements throughout.

Example implementations of the present disclosure are generally directed to a system, and corresponding method and computer-readable storage medium for certifying a design of a liquid container onboard a vehicle for manufacture of the liquid container. Example implementations may be described in the context of a fuel tank onboard an aircraft, but it should be understood that example implementations may be equally applicable to liquid containers onboard other vehicles. For example, implementations of the current disclosure may also be applicable to spacecraft with liquid cryogenic systems, ships and submarines with water ballast tanks and automobiles with fuel tanks. The calculation of slosh physics for design of these internal components is a significant problem that spans several different vehicle environments and systems, all of which are within the scope of framework of the current disclosure.

An example implementation of the current includes certification of seal caps inside a fuel tank of an aircraft. The current analysis of seal cap designs includes a series of physical experimental control tests to determine binary responses ("sufficient" or "not sufficient") for the seal cap design under the action of fuel slosh. Conditions of flight dynamics are not simulated in the process for certifying seal cap designs. An action of fuel slosh is induced purely through the action of harmonic oscillatory motion enacted by a motor or siren rocking the test bed environment.

Example implementations of the present disclosure instead make use of computational models to develop a virtual test bed process for exploring the action of fuel slosh on a fuel cap design and other internal components within the fuel tank. Furthermore, it provides the option of using recorded flight data to incorporate real flight maneuver dynamics into the simulation and the data processing and translation required to integrate the data into the simulation.

FIG. 1 illustrates a system 100 for certifying a design of a liquid container onboard a vehicle for manufacture of the liquid container, according to example implementations of the present disclosure. The system is configured to perform a number of different functions or operations, either automatically, under direct operator control, or some combination of thereof. In this regard, in some examples, the system is configured to perform one or more of its functions or operations automatically, that is, without being directly controlled by an operator. Additionally or alternatively, in some examples, the system is configured to perform one or more of its functions or operations under direct operator control.

The system 100 may include one or more of each of any of a number of different subsystems (each an individual system) for performing one or more of its functions or operations. As shown, for example, the system may include a modeling subsystem 102, parameters and dynamics subsystem 104, and simulation subsystem 106 coupled to one another. Although being shown together as part of the system, it should be understood that either of the subsystems may function or operate as a separate system without regard to the other. And further, it should be understood that the system may include one or more additional or alternative subsystems than those shown in FIG. 1.

The modeling subsystem 102 is generally configured to generate a computer geometric model of the liquid container according to the design of the liquid container. The parameters and dynamics subsystem 104 is generally configured to generate executable code to reproduce dynamics and operational parameters of the vehicle. In some examples, the dynamics of the vehicle include dynamics during a vehicle maneuver that is selectable from a database of vehicle dynamics for a plurality of vehicle maneuvers.

The simulation subsystem 106 is generally configured to execute a simulating application, via a processor configured to access the computer geometric model and the executable code, to at least perform a simulation of liquid sloshing in the liquid container onboard the vehicle subject to the dynamics and operational parameters, including the dynamics during a selected one or more of the plurality of vehicle maneuvers. The simulating application is executed to produce a prediction of loads and stresses on the liquid container from the simulation. The prediction has an associated prediction error; and accordingly, in some examples, the simulation is iterated to reduce the associated prediction error and thereby refine the prediction of loads and stresses on the liquid container. Respective locations within the liquid container that are more vulnerable to fatigue-risk are identified based on the prediction of loads and stresses on the liquid container. And the respective locations and the prediction of stresses on the liquid container at least at the respective locations are output, including in at least one instance, an indication of certification of the design of the liquid container based thereon.

Figure 2:
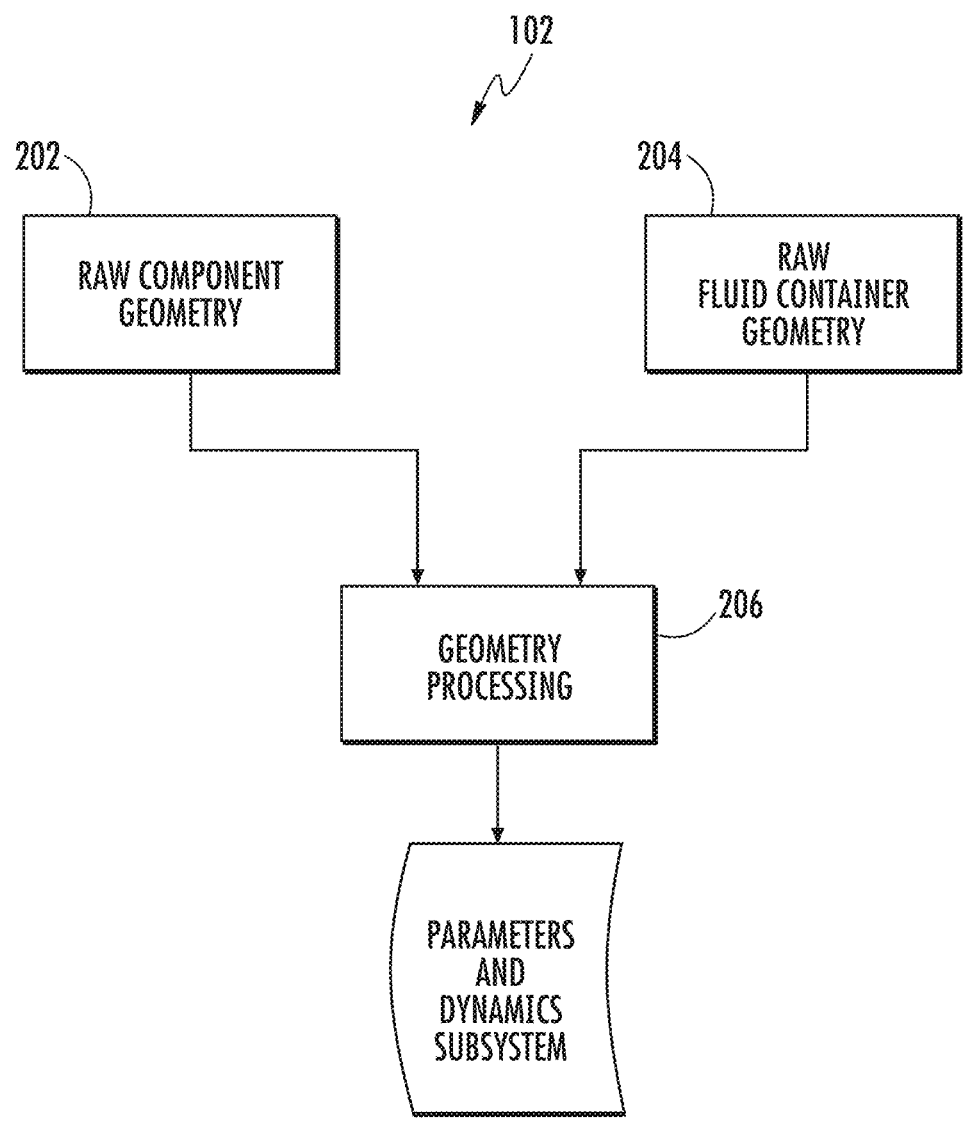
FIG. 2 is a block diagram that more particularly illustrates a modeling subsystem of the system of FIG. 1, according to example implementations of the present disclosure.

FIG. 2 is a block diagram of the modeling subsystem 102 according to some example implementations. As indicated, the modeling subsystem 102 is generally configured to generate a computer geometric model of the liquid container according to the design of the liquid container. In some examples, the liquid container includes a plurality of components integrated or assembled thereon. Also, in some examples, the modeling subsystem is configured to generate a computer geometric model of the plurality of components. A raw component geometry module 202 generates an initial raw component geometry file for the component. A raw fluid container geometry module 204 generates an initial raw fluid container geometry file for the liquid container. The raw fluid container geometry file and the raw component geometry file are created utilizing a computer aided design (CAD) tool or other parametric geometry design tool. These files provide the liquid container and the component geometry in their raw form. In other words, the files may consist of hundreds (if not tens of thousands) of spline surfaces, including many high level features insignificant to the simulation that would incur a heavy computational cost, and also possibly not be ready for simulation (i.e. geometric gaps or overlaps between surfaces that in the real product are supposed to be conjoined edges or corners). The files require cleaning to be simulation ready.

A geometry processing module 206 is configured to import the raw fluid container geometry file and raw component geometry file to clean up and integrate the raw geometry files. This includes various cleanup tasks such as deleting small features that will not affect the simulation physics but would be computationally expensive to include, decimating face data made of hundreds of sub-faces and replacing them with smaller, simpler face representations of faces that gives accurate approximations of the original geometry, elimination of all geometry other than the "inner mold line" (i.e. the geometry that actually makes contact with the sloshing liquid and/or ambient gas), and clean up any remaining gaps and holes between surfaces that are supposed to connect but due to numerical limitations do not. Additionally, as discussed below, the geometry processing module 206 is configured to integrate the component models into the full fluid container models based on geometric selections regarding the location, size, and orientation.

FIG. 3A illustrates a model of a design of a liquid container and a component embodied as respectively a fuel tank 300 and a seal cap 302, according to some example implementations of the present disclosure. As shown, the seal cap 302 includes a cap 304 and a sealant 306 by which the cap may be affixed to the fuel tank.

As stated above, the liquid container may include a plurality of components integrated or assembled thereon. In some examples, the modeling subsystem 102 being configured to generate the computer geometric model of the liquid container includes being configured to generate a first computer geometric model of the liquid container without the plurality of components. In these examples, the modeling subsystem is also configured to generate a plurality of second computer geometric models of the plurality of components, and then integrate the first computer geometric model and the plurality of second computer geometric models to generate the computer geometric model of the liquid container, as illustrated in FIG. 3B for the fuel tank 300 and seal cap 302.

Referring back to FIG. 1, again, the parameters and dynamics subsystem 104 is configured to generate executable code to reproduce dynamics and operational parameters of the vehicle. The dynamics of the vehicle includes dynamics during a vehicle maneuver that may be selectable from a database of vehicle dynamics for a plurality of vehicle maneuvers. In some examples, the parameters and dynamics subsystem is configured to receive operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container. In some examples, vehicle maneuvers include a selected flight maneuver from a list of available options. These maneuvers could include liftoff, ascent, laminar or turbulent cruise, evasive maneuvers, combat maneuvers, rolls, banks, descents, etc. Additional maneuvers may be added to the database as needed and/or as data becomes available.

The simulation subsystem 106 is configured to execute a simulating application, via a processor configured to access the computer geometric model and the executable code, to at least perform a simulation of liquid sloshing in the liquid container onboard the vehicle subject to the dynamics and operational parameters, including the dynamics during a selected one or more of the plurality of vehicle maneuvers. The simulation subsystem is configured to produce a prediction of loads and stresses on the liquid container from the simulation where the prediction has an associated prediction error. In some examples, an iterative calculation is launched where a pressure and velocity flow field, induced by slosh and output from the parameters and dynamics subsystem 104 is calculated, and this pressure and velocity flow field provides the external force data. In some examples, simulation subsystem 106 includes a computational fluid dynamics (CFD) software package. Other computational models could be substituted based on the above mentioned specified fidelity preferences.

In the example implementation where the liquid container is a fuel tank onboard an aircraft, the parameters and dynamics subsystem 104 is generally configured to produce various flight dynamics. The flight dynamics may include emulation of simple harmonic oscillation as with a testing apparatus of the Air Force Research Laboratory (AFRL) or, as mentioned above, full actual flight dynamics data. The full actual flight dynamics data may be used to fully mimic maneuvers captured from real flights, such as aircraft rolls, ascents, descents; heavy turbulence, etc. The simulation subsystem 106 is also configured to iterate the simulation to reduce the associated prediction error and thereby refine the prediction of loads and stresses on the liquid container. The calculation may be run until certain criteria of convergence are achieved. The convergence criteria are adjustable, depending on the needs of a user of the system.

Figure 4:
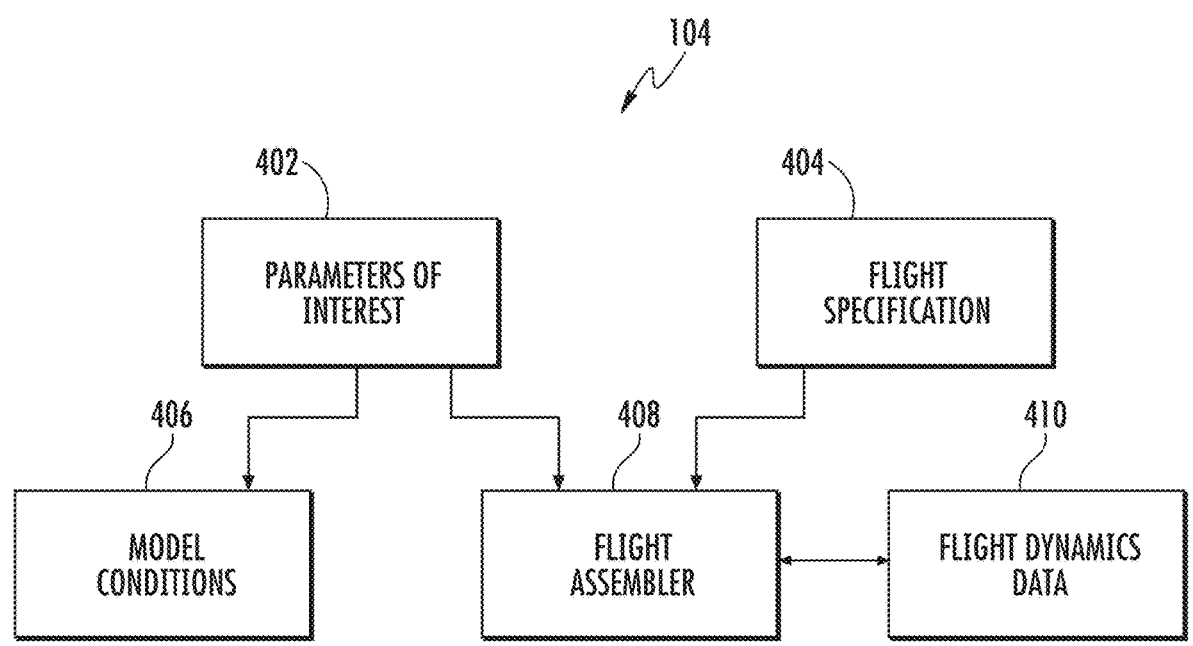
FIG. 4 is a block diagram that more particularly illustrates a parameters and dynamics subsystem of the system of FIG. 1, according to some example implementations of the present disclosure.
Figure 5:
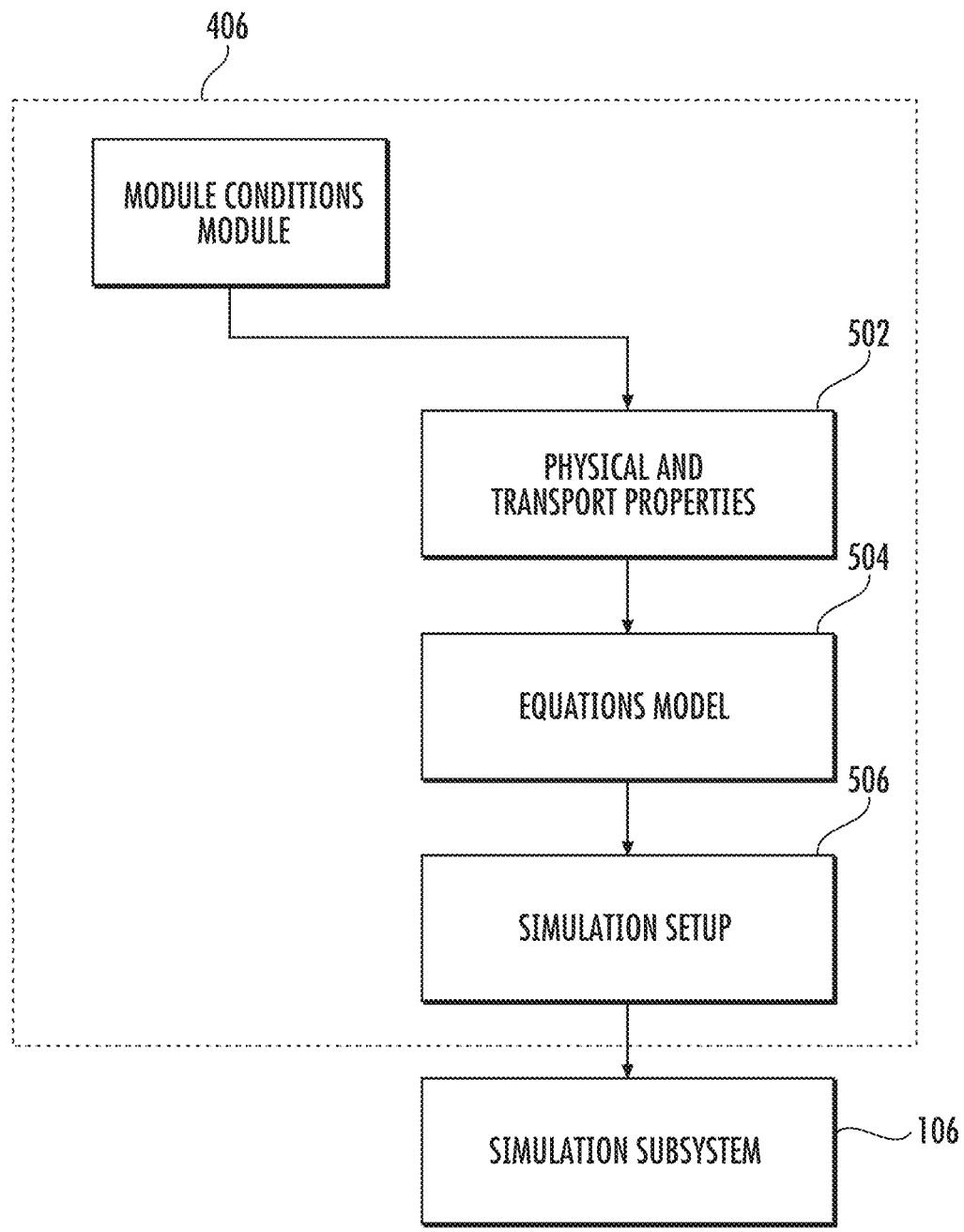
FIGS. 5 and 6 are block diagrams that even more particularly illustrate subsystems of the parameters and dynamics subsystem of FIG. 4, according to some example implementations of the present disclosure.
Figure 6:
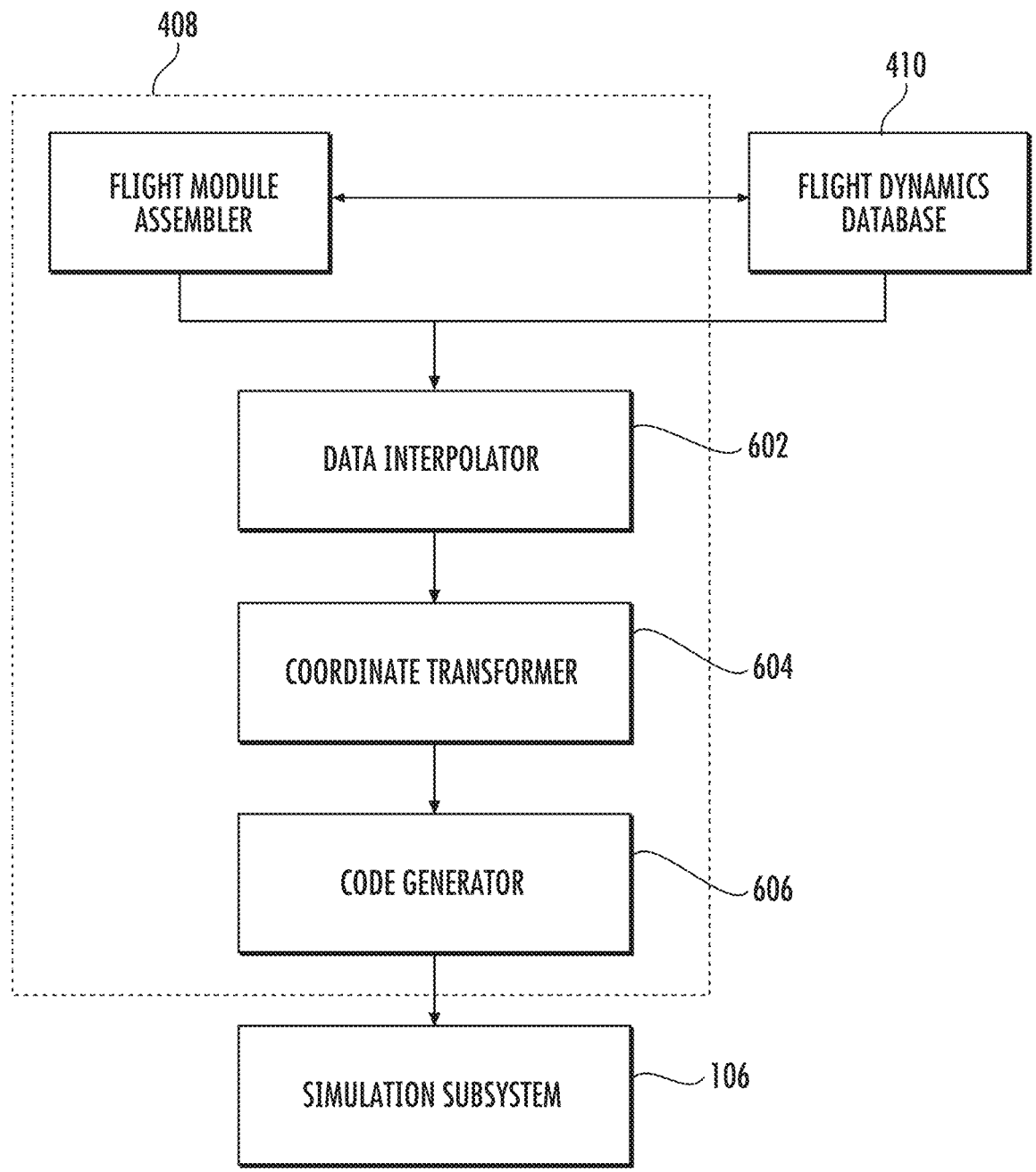

FIGS. 4, 5 and 6 are block diagrams that more particularly illustrate the parameters and dynamics subsystem 104 and various ones of its subsystems according to some example implementations. As illustrated in FIG. 4, in some examples, the parameters and dynamics subsystem includes a parameters-of-interest module 402, a flight specification module 404, a model conditions module 406, and a flight assembler module 408. The parameters-of-interest module 402 is configured to receive and process specified options and parameters-of-interest that describe desired vehicle operating conditions and simulation fidelity. Fidelity may refer to the accuracy of a simulation in how well it represents the modeled physics and dynamical system. In some examples, the vehicle operating conditions includes the operating liquid container temperature, liquid type, ambient gas in the liquid container and the initial fill level of liquid in the liquid container. The flight specification module 404, also illustrated in FIG. 4, is configured to receive and process a selection of a particular flight maneuver.

The model conditions module 406 is configured to receive the specified options and parameters-of-interest and to generate programming instructions preparing the received data for the simulation subsystem 106 illustrated in FIG. 1. The flight assembler module 408 is generally configured to access the flight dynamics database 410 to retrieve the flight data from the selected particular flight maneuver and to also receive a selection of a particular flight maneuver. Additionally, the flight assembler module is configured to output an executable code reproducing the selected particular flight maneuver dynamics for integration with the simulation subsystem 106 of FIG. 1

FIG. 5 is a block diagram that more particularly illustrates the model conditions module 406 according to some example implementations. The model conditions module 406 is generally configured to include a physical and vehicle motion properties module 502, an equations module 504, and a simulation setup module 506. As stated above, the model conditions module 406 is generally configured to receive output from the parameters-of-interest module 402 and generate programming instructions output (e.g., a script) to set up the specific operating conditions for the simulation subsystem 106 as specified by the options and parameters-of-interest. In this regard, the physical and vehicle motion properties module 502 is configured to set physical and vehicle motion properties, such as background and operating pressure, coefficient of viscosity, and temperature. Given the physical and vehicle motion properties, the equations module 504 is configured to set equations to be used (e.g., incompressible vs. compressible equations, two-dimensional 2D versus three-dimensional 3D, turbulent or laminar, choice of turbulence model, order accuracy, etc.). The simulations setup module 506 is configured to add all of the simulation setup parameters together to create the script that will initiate the simulation subsystem.

FIG. 6 more particularly illustrates the flight assembler module 408 according to some example implementations. As mentioned herein above, the flight assembler module is configured to receive as input the selection of a particular flight maneuver. The flight assembler module is generally configured to access the flight dynamics database 410 to retrieve the flight data from the selected particular flight maneuver. The flight dynamics database may be a storage database of flight kinematic sensor data taken from flight tests. The flight assembler module may take this data and process the data by interpolating to an appropriate resolution and kinematically transforming the data into appropriate frames of reference, kinematic description systems, and produces an executable code that will integrate with the simulation subsystem 106 of FIG. 1 to reproduce the selected particular flight maneuver dynamics during the simulation.

As shown in FIG. 6, the flight assembler module 408 may include a data interpolator module 602, a coordinate transformer module 604, and a code generator module 606. The flight assembler module is configured to extract any required data from the flight dynamics database 410, which may be passed to the data interpolator module. The data interpolator module is configured to interpolate a suitable function representation of the data to the required fidelity. The coordinate transformer module 604 is configured to consume the interpolated function and perform any required coordinate system or affine transformations and rotations to represent the dynamics in the frame of reference of the fuel tank onboard the aircraft. In this regard, the code generator module is generally configured to take the transformed mathematical functions which describe the dynamics and produce the executable code that will be used in the simulation. The executable code may be plugged into the simulation subsystem 106 of FIG. 1.

Referring back to FIG. 4, the flight assembler 408 of the parameters and dynamics subsystem 104 is configured to receive specifications of simulation fidelity from the flight specification module 404 and simulation conditions from the parameters-of-interest module 402 to generate the script used to set up the specific operational parameters mentioned above. In other words, the parameters and dynamics subsystem may prepare simulation conditions for the simulation subsystem 106. The programming instructions may include all of the numerical processing specifications common to all scenarios from a slosh physics and computational perspective (e.g., selecting appropriate numerical schemes and numerical constants for the efficient and stable solution of an underlying set of partial differential equations including Navier-Stokes fluid equations and multiphase finite volume equations.)

As mentioned above, the parameters and dynamics subsystem 104 is also generally configured to receive a selection from an available set of flight maneuvers. Referring to FIG. 4, the parameters and dynamics subsystem may access the flight dynamics database 410 to retrieve flight data from the selected maneuver of interest. The flight dynamics database is a storage database of flight kinematic sensor data, harmonic functions and other models, etc. taken from flight tests. Alternatively, this dynamic/kinematic data input can be instead replaced by analytically formulated dynamics if desired. In some examples, the parameters and dynamics subsystem is configured to receive selected dynamics from the database of vehicle dynamics for the plurality of vehicle maneuvers including two or more of takeoff, launch, ascent, roll, bank, descent, right/left turn, U-turn, lane change, launch from stop, brake, curve-handling, and/or any other appropriate maneuvers. In some examples, the parameters and dynamics subsystem is configured to receive operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container.

As previously mentioned, the parameters and dynamics subsystem 104 processes the retrieved flight data by interpolating to an appropriate resolution and kinematically transforming the data into the appropriate frames of reference, kinematic description systems, and produces an executable code that will integrate with the simulation subsystem 106 to reproduce these flight maneuver dynamics during the simulation.

Figure 7:
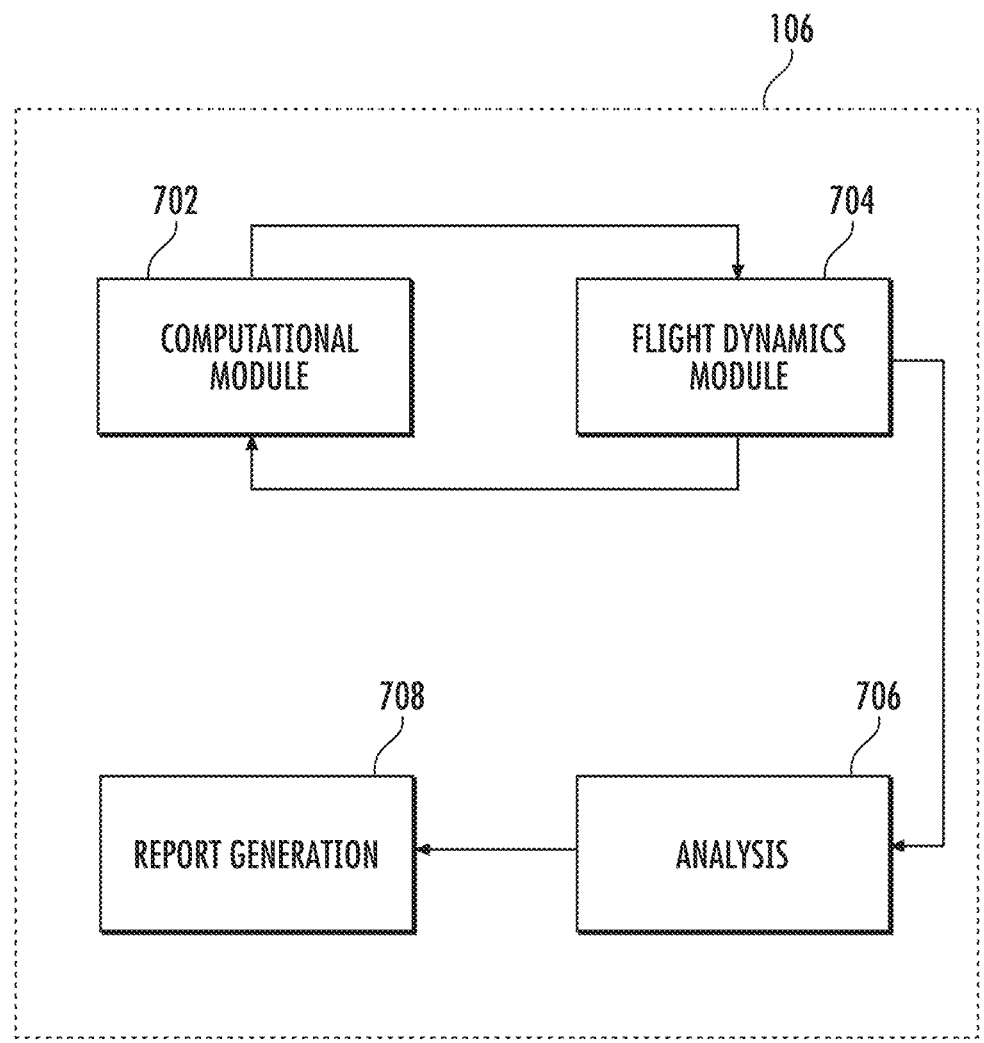
FIG. 7 is a block diagram of a simulation subsystem of the system of FIG. 1, according to example implementations of the present disclosure.

FIG. 7 is a block diagram that more particularly illustrates the simulation subsystem 106, according to some example implementations. The simulation subsystem is configured to include a computational model module 702, a flight dynamics module 704, an analysis module 706, and a report generation module 708. In some examples, the simulation subsystem is configured to launch an iterative loop between two primary coupled components: the computational model module and a flight dynamics module. The computational model module is configured to calculate the result of a pressure and velocity flow field induced by slosh, and the flight dynamics module is generally configured to provide external force data. In this regard, the finite volume method or some other parabolic-like partial differential equation solver combined with the appropriate numerical settings and input parameters that have been prepared by the upstream modules may be utilized.

As stated previously herein, an example computational model may include a CFD software package, either a native software package or another available commercial package such as Flow3D or ANSYS® Fluent. Other computational models could be substituted based on the specified fidelity preferences. According to example implementations of the present disclosure, ANSYS® commercial software may be employed. In terms of numerical configuration, a second order implicit transient finite volume with the standard k-Omega RANS turbulence model, Green-Gauss node-based gradient calculations, body-force weighted pressure calculations, and implicit body forcing may be utilized. To handle the multiphase components of the slosh, the implicit volume of fluid method with interfacial anti-diffusion and surface tension modeling may also be utilized. If a faster computational package at the cost of lower fidelity is required, there are algebraic model systems of equations that could be utilized instead, which may replace the computer geometric model module 702 with a simpler simulation model that could be formulated and coded to take the place of the computer module. As stated previously, fidelity may refer to the accuracy of a model or simulation in how well it represents the modeled physics and dynamical system. An algebraic model may have lower fidelity and much lower computational cost.

The residual of an approximate solution of a partial differential equation refers to the error remaining in the equation after the approximate solution is substituted for the real one. The calculation is run until certain criteria of convergence are achieved, in particular with regard to the size of the residuals of our solutions of the partial differential equations being sufficiently small (below a certain tolerance) or sufficiently unchanged after subsequent calculation iterations (again below a specified tolerance). The convergence criteria are adjustable, depending on the needs of the user.

After the simulation predicting the slosh is complete, the calculated data may be transmitted to the analysis module 706 for further calculation. The analysis module is configured to take pressures and shear stresses from the data and integrate them across the surface of the tank and its components in order to calculate shear stresses on the components and estimate fatigue-risk over time.

The simulation subsystem 106 is configured to identify respective locations within the liquid container that are more vulnerable to fatigue-risk based on the prediction of loads and stresses on the liquid container. After prediction of the slosh and its effects upon the fuel tank components are complete, the results may be received for further calculation (integration of pressures to yield forces acting on the surface of fuel caps, etc.). And the simulation subsystem is configured to output the respective locations and the prediction of stresses on the liquid container at least at the respective locations, including in at least one instance, an indication of certification of the design of the liquid container based thereon.

Additionally, graphical data may be collected in the form of videos and still shots of contours of important attributes at important locations (e.g., total pressure, absolute pressure, shear stress, and total stress; locations specified by the user, presumably the components of interest). The report generation module 708 is generally configured to graph the statistics and various results including the still shots and videos that may also be collected into a report, in a standard format such as PowerPoint or PDF.

Figure 8A:
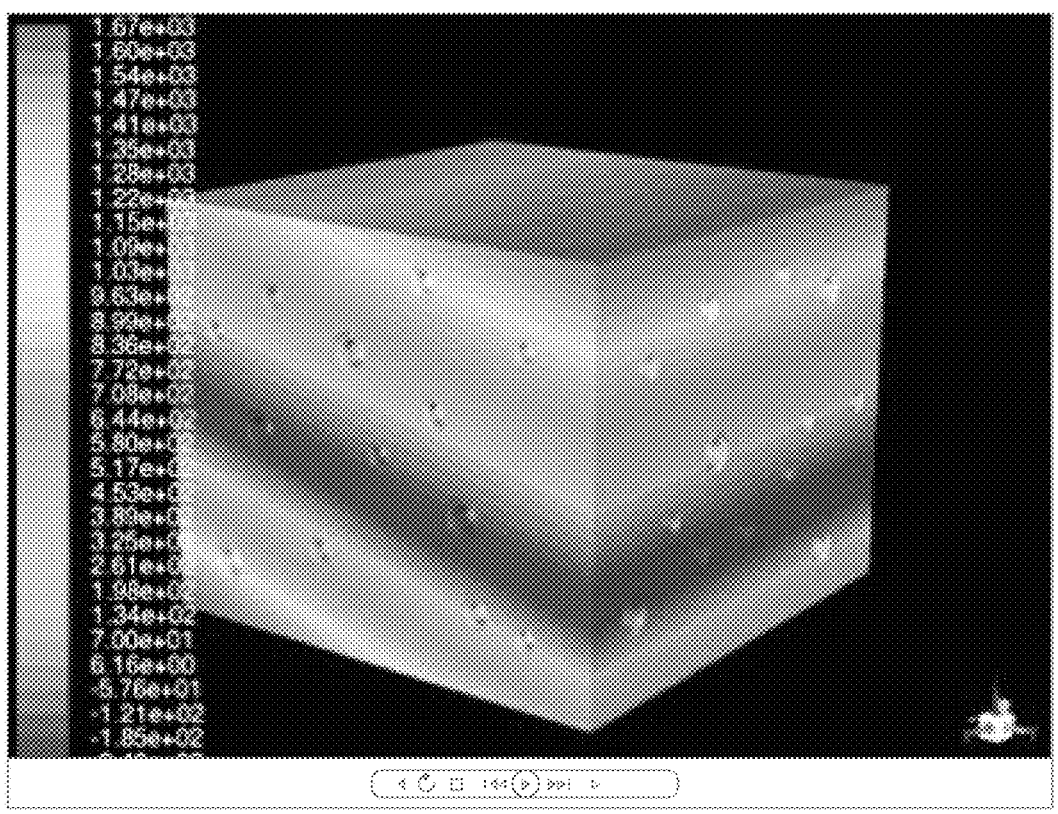
FIGS. 8A, 8B and 9 are sample graphical outputs of the system of FIG. 1, according to example implementations of the present disclosure.
Figure 8B:
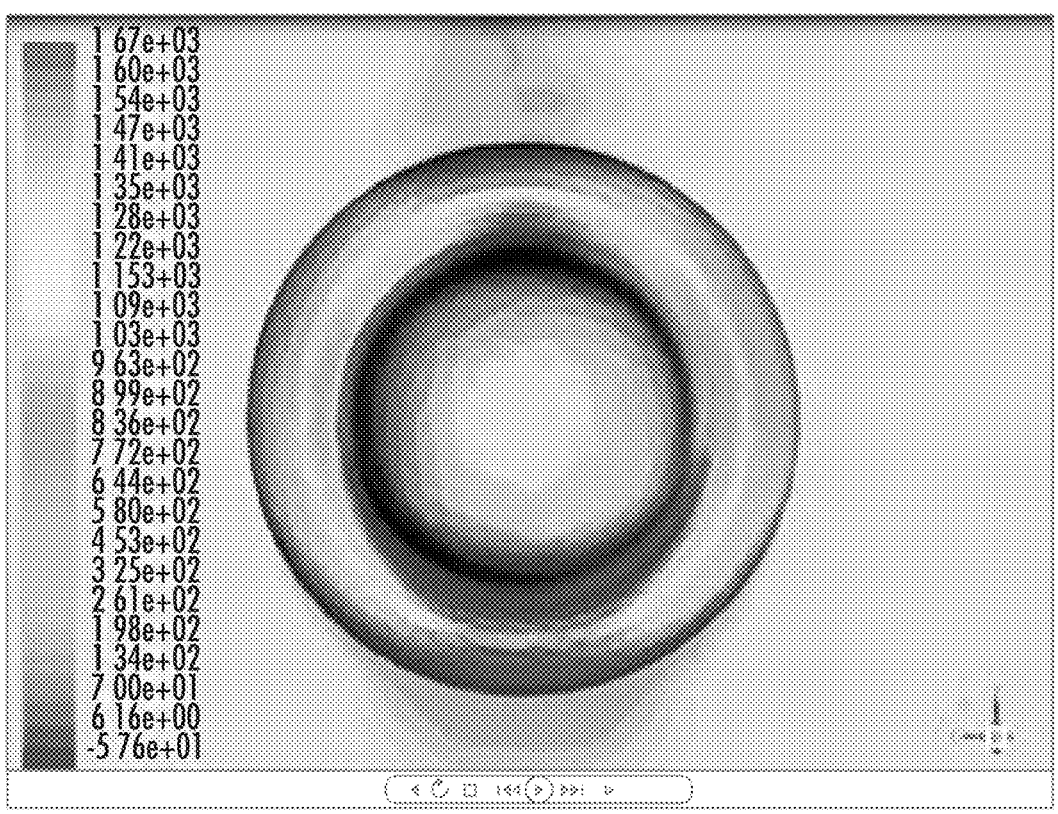

Finally, this quantitative information about the component stresses and locations of fatigue-risk prediction may be passed on to a user in the form of results presented to display the impact of the current design. Additionally, basic statistics are gathered across the time-dependent data such as maximum values, minimum values, average values with respect to surface area, and integrated standard deviation with respect to surface areas. These are calculated for each component of interest to the user. FIGS. 8A and 8B illustrate two example graphical outputs. FIG. 8A illustrates an exemplary time step sample of the slosh results calculated at a single instance in time on the whole liquid container. FIG. 8B illustrates pressure contours of an individual fuel tank component such as a fuel cap. Utilizing the inputs generated by the analysis module 706, desired quantities to be measured may be calculated and accumulated in an automated way. These results are collected in the report generation module 708.

Figure 9:
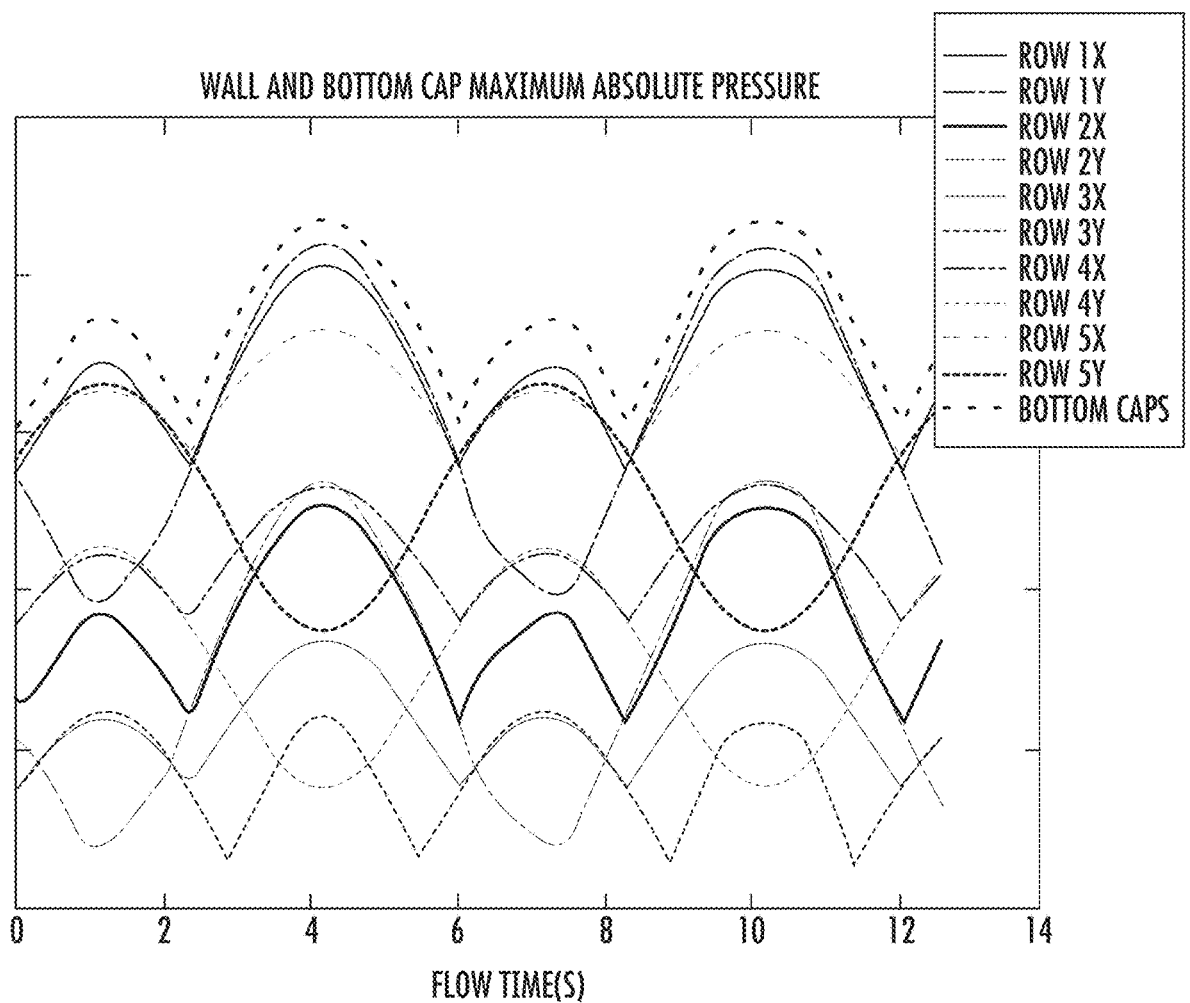

Upon completion of the calculations of collected fuel tank slosh data, the results may be programmed to be output as X/Y plots of maximum, minimum and average static, absolute, dynamic and total pressures in the full domain and across certain surfaces of interest. The reports may also be output as X/Y plots of maximum, minimum and average velocities in the full domain and across certain surfaces of interest with results binned according to zone. The report generation module 708 is configured to produce the X/Y plots. FIG. 9 illustrates an example graph corresponding to one of these outputs. More specifically, FIG. 9 illustrates an output graph of one of the calculation categories corresponding in to maximum absolute pressure of some selected components of interest. The y-axis scale has been removed for simplicity.

In instances where the results regarding the component stresses and locations of fatigue-risk prediction indicate that the design of the liquid container and/or the component therein is sufficient, the design of the liquid container and/or the component therein is thereby certified for manufacture. The analysis module 706 may be further configured to output the design of the liquid container and/or the component therein in at least one instance to a manufacturing system for production thereof according to the certified design. As, in these instances, the design of the liquid container and/or the component therein is identified as being certified for implementation readiness and optimization with regard to stress and fatigue-risk.

In instances where the results regarding the component stresses and locations of fatigue-risk prediction indicate that the design of the liquid container and/or the component therein is insufficient, the system 100 may produce a modified design of the liquid container. In other examples, the modified design may be produced elsewhere and supplied back to the system. The modified design is based on the respective locations within the liquid container that are more vulnerable to fatigue-risk, and the prediction of stresses on the liquid container at least at the respective locations. Quantitative information from the example above regarding the fuel cap behavior prediction may be output in the form of results presented to display the impact of the current design of the fuel tank and the seal cap. The system may be configured to generate a modified computer geometric model of the liquid container according to the modified design; and re-execute the simulating application via the computer processor configured to access the modified computer geometric model and the executable code.

By locating the components with the highest risk (for example, largest induced stress, as indicated by the reports), the designer will know which components would benefit the most for redesign or relocation. The pressure, stress and/or strain maps on the surfaces can be used to indicate in which direction the components could be moved, and in which areas the stress and fatigue-risk will likely be the lowest. These design changes can then be implemented to improve the reliability of the design and minimize risk, while iterating use of the tool for iterative optimization if necessary.

The results can be also be used to induce an informed change of the seal cap design to improve the behavior of slosh. Furthermore, the results could be used in an automated way to inform changes to the design process, potentially leading to an optimization model that could be used to iteratively optimize the fuel cap design for some objective feature.

Figure 10:
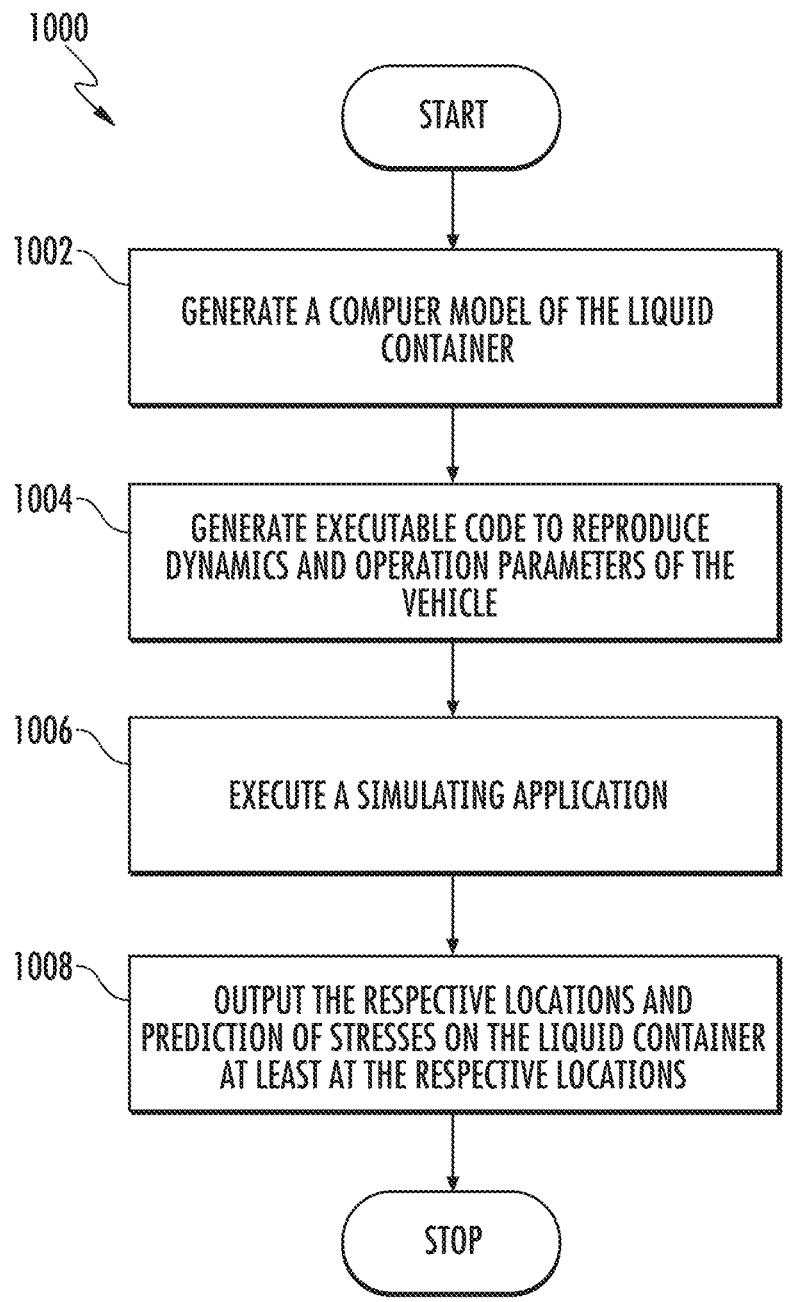
FIG. 10 is a flowchart illustrating operations in a method of certifying a design of the liquid container onboard a vehicle for manufacture of the liquid container, according to example implementations of the present disclosure.

FIG. 10 is a flowchart illustrating various steps in a method 1000 for certifying a design of a liquid container onboard a vehicle for manufacture of the liquid. As shown at block 1002, the method includes generating a computer geometric model of the liquid container according to the design of the liquid container. As shown in block 1004, the method includes generating executable code to reproduce dynamics and operational parameters of the vehicle, where the dynamics of the vehicle including dynamics during a vehicle maneuver that is selectable from a database of vehicle dynamics for a plurality of vehicle maneuvers. The method includes executing a simulating application, as shown at block 1006. Executing the simulation application includes performing a simulation of liquid sloshing in the liquid container onboard the vehicle subject to the dynamics and operational parameters, including the dynamics during a selected one or more of the plurality of vehicle maneuvers, and producing a prediction of loads and stresses on the liquid container from the simulation, the prediction having an associated prediction error. And the method includes outputting the respective locations and the prediction of stresses on the liquid container at least at the respective locations, including in at least one instance, an indication of certification of the design of the liquid container based thereon, as shown in block 1008.

According to example implementations of the present disclosure, the system 100, as illustrated in FIG. 1, and its subsystems including the modeling subsystem 102, parameters and dynamics subsystem 104 and simulation subsystem 106 may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 11:
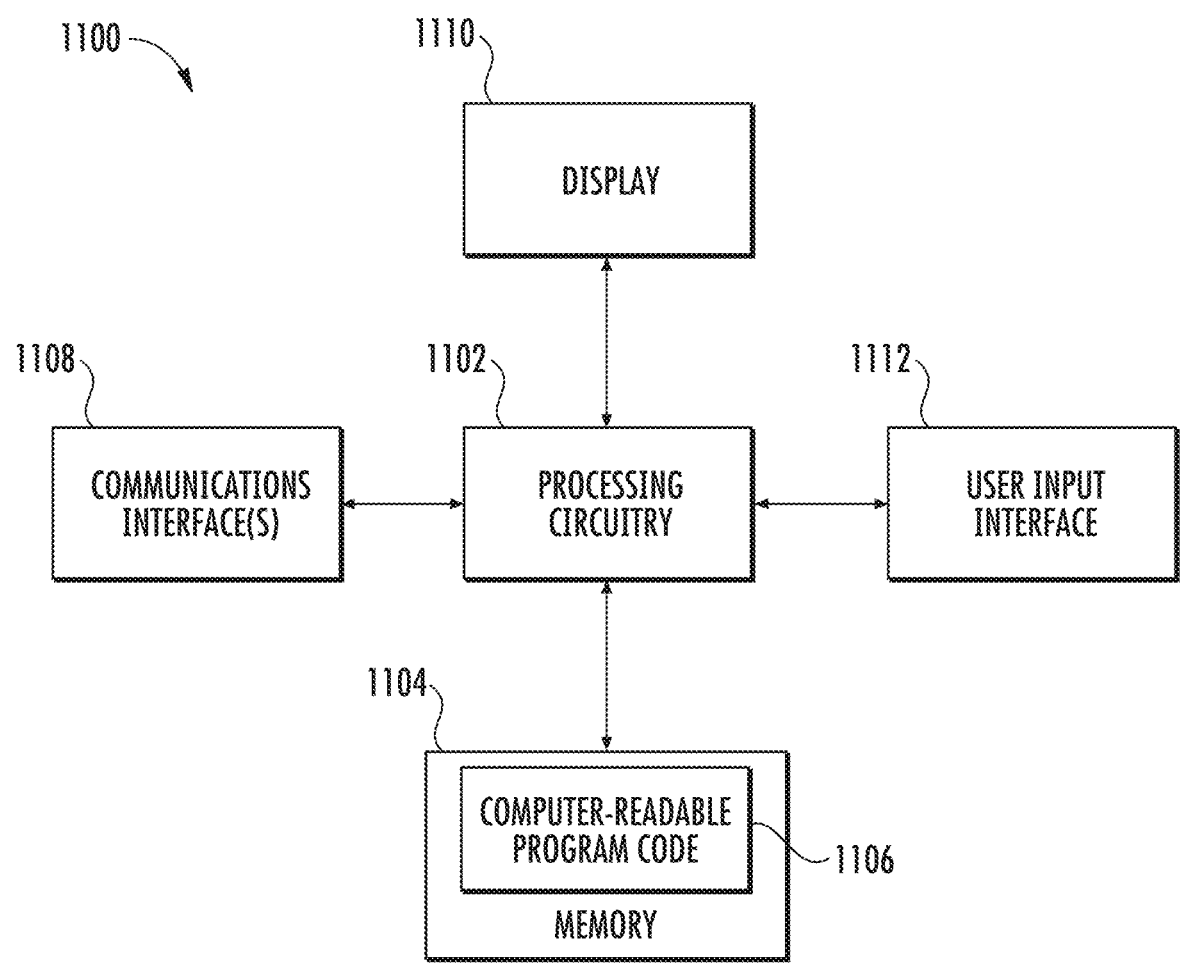
FIG. 11 illustrates an apparatus according to some example implementations.

FIG. 11 illustrates an apparatus 1100 according to some example implementations of the present disclosure. Generally, an apparatus of example implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor 1102 (e.g., processor unit) connected to a memory 1104 (e.g., storage device).

The processor 1102 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 1104 (of the same or another apparatus).

The processor 1102 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 1104 is generally any piece of computer hardware that is capable of storing information such as, for example, data, computer programs (e.g., computer-readable program code 1106) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 1104, the processor 1102 may also be connected to one or more interfaces for displaying, transmitting and/or receiving information. The interfaces may include a communications interface 1108 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless MC (WNIC) or the like.

The user interfaces may include a display 1110 and/or one or more user input interfaces 1112 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by processor, or storage of instructions in a computer-readable storage medium, supports combinations of operations for performing the specified functions. In this manner, an apparatus 1100 may include processor 1102 and a computer-readable storage medium or memory 1104 coupled to the processor, where the processor is configured to execute computer-readable program code 1106 stored in the memory. It will also be understood that one or more functions, and combinations of functions, may be implemented by special purpose hardware-based computer systems and/or processor which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
    generating a computer geometric model of a liquid container according to a design of the liquid container, wherein the liquid container includes a plurality of components affixed thereon, and generating the computer geometric model of the liquid container includes:
        generating a first computer geometric model of the liquid container without the plurality of components affixed to the liquid container;
        generating a plurality of second computer geometric models of the plurality of components that are separate from the first computer geometric model; and
        integrating the first computer geometric model and the plurality of second computer geometric models to generate the computer geometric model of the liquid container with the plurality of components affixed to the liquid container;
    generating executable code to reproduce dynamics and operational parameters of the vehicle, the dynamics of the vehicle including dynamics during a vehicle maneuver that is selectable from a database of vehicle dynamics for a plurality of vehicle maneuvers;
    executing a simulating application, via a computer processor configured to access the computer geometric model and the executable code, to at least:
    perform a simulation of liquid sloshing in the liquid container onboard the vehicle subject to the dynamics and operational parameters, including the dynamics during a selected one or more of the plurality of vehicle maneuvers, and produce a prediction of loads and stresses on the liquid container from the simulation, the prediction having an associated prediction error; and
    iterate the simulation to reduce the associated prediction error and thereby refine the prediction of loads and stresses on the liquid container, the prediction of loads and stresses based at least in part on force data associated with a pressure and a velocity flow field induced by the liquid sloshing in the liquid container and throughout an interior of the liquid container;
    identifying respective locations within the liquid container that are more vulnerable to fatigue-risk based on the prediction of loads and stresses on the liquid container; and
    outputting the respective locations and the prediction of stresses on the liquid container at least at the respective locations, including in at least one instance, an indication of certification of the design of the liquid container based thereon.

2. The method of claim 1, wherein generating the executable code to reproduce dynamics and operational parameters of the vehicle includes receiving selected dynamics from the database of vehicle dynamics for the plurality of vehicle maneuvers including two or more of takeoff, launch, ascent, roll, bank, descent, laminar or turbulent cruise, evasive maneuvers, right/left turn, U-turn, lane change, launch from stop, brake, or curve-handling.

3. The method of claim 1, wherein generating the executable code to reproduce dynamics and operational parameters of the vehicle includes receiving operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container.

4. The method of claim 1,
wherein identifying respective locations within the container that are more vulnerable to fatigue-risk includes determining a location of a fluid interphase boundary surface based on the pressure and the velocity flow field.

5. The method of claim 1, wherein outputting the respective locations and the prediction of stresses includes, in at least one other instance:
producing a modified design of the liquid container based on the respective locations within the liquid container that are more vulnerable to fatigue-risk, and the prediction of stresses on the liquid container at least at the respective locations;
generating a modified computer geometric model of the liquid container according to the modified design; and
re-executing the simulating application via the computer processor configured to access the modified computer geometric model and the executable code.

6. The method of claim 1 further comprising outputting the design for production of the liquid container according thereto.

7. The method of claim 1, wherein the prediction of loads and stresses on the liquid container from the simulation comprises a prediction of a shear stress.

8. An apparatus comprising a processor and a memory storing executable instructions that, in response to execution by the processor, cause the apparatus to at least:
generate a computer geometric model of a liquid container according to a design of the liquid container, wherein the liquid container includes a plurality of components affixed thereon, and the apparatus being caused to generate the computer geometric model of the liquid container includes being caused to:
generate a first computer geometric model of the liquid container without the plurality of components affixed to the liquid container;
generate a plurality of second computer geometric models of the plurality of components that are separate from the first computer geometric model; and
integrate the first computer geometric model and the plurality of second computer geometric models to generate the computer geometric model of the liquid container with the plurality of components affixed to the liquid container;
generate executable code to reproduce dynamics and operational parameters of the vehicle, the dynamics of the vehicle including dynamics during a vehicle maneuver that is selectable from a database of vehicle dynamics for a plurality of vehicle maneuvers;
execute a simulating application, via the processor configured to access the computer geometric model and the executable code, to at least:
perform a simulation of liquid sloshing in the liquid container onboard the vehicle subject to the dynamics and operational parameters, including the dynamics during a selected one or more of the plurality of vehicle maneuvers, and produce a prediction of loads and stresses on the liquid container from the simulation, the prediction having an associated prediction error; and
iterate the simulation to reduce the associated prediction error and thereby refine the prediction of loads and stresses on the liquid container, the prediction of loads and stresses based at least in part on force data associated with a pressure and a velocity flow field induced by the liquid sloshing in the liquid container and throughout an interior of the liquid container;
identify respective locations within the liquid container that are more vulnerable to fatigue-risk based on the prediction of loads and stresses on the liquid container; and
output the respective locations and the prediction of stresses on the liquid container at least at the respective locations, including in at least one instance, an indication of certification of the design of the liquid container based thereon.

9. The apparatus of claim 8, wherein the apparatus being caused to generate the executable code to reproduce dynamics and operational parameters of the vehicle includes being caused to receive selected dynamics from the database of vehicle dynamics for the plurality of vehicle maneuvers including two or more of takeoff, launch, ascent, roll, bank, descent, laminar or turbulent cruise, evasive maneuvers, right/left turn, U-turn, lane change, launch from stop, brake, or curve-handling.

10. The apparatus of claim 8, wherein the apparatus being caused to generate the executable code to reproduce dynamics and operational parameters of the vehicle includes being caused to receive operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container.

11. The apparatus of claim 8,
wherein the apparatus being caused to identify respective locations within the container that are more vulnerable to fatigue-risk includes being caused to further determine a location of a fluid interphase boundary surface based on the pressure and the velocity flow field.

12. The apparatus of claim 8, wherein the memory stores executable instructions that, in response to execution by the processor, cause the apparatus to further:
produce a modified design of the liquid container based on the respective locations within the liquid container that are more vulnerable to fatigue-risk, and the prediction of stresses on the liquid container at least at the respective locations;
generate a modified computer geometric model of the liquid container according to the modified design; and
re-execute the simulating application via the computer processor configured to access the modified computer geometric model and the executable code.

13. The apparatus of claim 8, wherein the memory stores executable instructions that, in response to execution by the processor, cause the apparatus to further output the design for production of the liquid container according thereto.

14. The apparatus of claim 8, wherein the prediction of loads and stresses on the liquid container from the simulation comprises a prediction of a shear stress.

15. A computer-readable storage medium that is non-transitory and has computer-readable program code portions stored therein that in response to execution by a processor, cause an apparatus to at least:
generate a computer geometric model of a liquid container according to a design of the liquid container, wherein the liquid container includes a plurality of components affixed thereon, and the apparatus being caused to generate the computer geometric model of the liquid container includes being caused to:
generate a first computer geometric model of the liquid container without the plurality of components affixed to the liquid container;
generate a plurality of second computer geometric models of the plurality of components that are separate from the first computer geometric model; and
integrate the first computer geometric model and the plurality of second computer geometric models to generate the computer geometric model of the liquid container with the plurality of components affixed to the liquid container;
generate executable code to reproduce dynamics and operational parameters of the vehicle, the dynamics of the vehicle including dynamics during a vehicle maneuver that is selectable from a database of vehicle dynamics for a plurality of vehicle maneuvers;
execute a simulating application, via the processor configured to access the computer geometric model and the executable code, to at least:
perform a simulation of liquid sloshing in the liquid container onboard the vehicle subject to the dynamics and operational parameters, including the dynamics during a selected one or more of the plurality of vehicle maneuvers, and produce a prediction of loads and stresses on the liquid container from the simulation, the prediction having an associated prediction error; and
iterate the simulation to reduce the associated prediction error and thereby refine the prediction of loads and stresses on the liquid container, the prediction of loads and stresses based at least in part on force data associated with a pressure and a velocity flow field induced by the liquid sloshing in the liquid container and throughout an interior of the liquid container;
identify respective locations within the liquid container that are more vulnerable to fatigue-risk based on the prediction of loads and stresses on the liquid container; and
output the respective locations and the prediction of stresses on the liquid container at least at the respective locations, including in at least one instance, an indication of certification of the design of the liquid container based thereon.

16. The computer-readable storage medium of claim 15, wherein the apparatus being caused to generate the executable code to reproduce dynamics and operational parameters of the vehicle includes being caused to receive selected dynamics from the database of vehicle dynamics for the plurality of vehicle maneuvers including two or more of takeoff, launch, ascent, roll, bank, descent, laminar or turbulent cruise, evasive maneuvers, right/left turn, U-turn, lane change, launch from stop, brake, or curve-handling.

17. The computer-readable storage medium of claim 15, wherein the apparatus being caused to generate the executable code to reproduce dynamics and operational parameters of the vehicle includes being caused to receive operational parameters from a database of a plurality of operational parameters of the vehicle, including two or more of a temperature of the liquid container onboard the vehicle, a type of liquid in the liquid container, ambient gas in the liquid container, or initial fill level of liquid in the liquid container.

18. The computer-readable storage medium of claim 15, wherein the apparatus being caused to identify respective locations within the container that are more vulnerable to fatigue-risk includes being caused to further determine a location of a fluid interphase boundary surface based on the pressure and the velocity flow field.

19. The computer-readable storage medium of claim 15, having computer-readable program code portions stored therein that in response to execution by the processor, cause the apparatus to further:
produce a modified design of the liquid container based on the respective locations within the liquid container that are more vulnerable to fatigue-risk, and the prediction of stresses on the liquid container at least at the respective locations;
generate a modified computer geometric model of the liquid container according to the modified design; and
re-execute the simulating application via the computer processor configured to access the modified computer geometric model and the executable code.

20. The computer-readable storage medium of claim 15, having computer-readable program code portions stored therein that in response to execution by the processor, cause the apparatus to further, output the design for production of the liquid container according thereto.

21. The computer-readable storage medium of claim 15, wherein the prediction of loads and stresses on the liquid container from the simulation comprises a prediction of a shear stress.

* * * * *